United States Patent [19]
Hawley et al.

[11] Patent Number: 5,576,576
[45] Date of Patent: Nov. 19, 1996

[54] ABOVE VIA METAL-TO-METAL ANTIFUSE

[75] Inventors: Frank W. Hawley, Campbell; Yeouchung Yen, San Jose, both of Calif.

[73] Assignee: Actel Corporation, Sunnyvale, Calif.

[21] Appl. No.: 377,496

[22] Filed: Jan. 24, 1995

Related U.S. Application Data

[60] Continuation of Ser. No. 122,747, Sep. 17, 1993, abandoned, which is a division of Ser. No. 971,737, Nov. 5, 1992, Pat. No. 5,301,232.

[51] Int. Cl.$^6$ ............................ H01L 29/04; H01L 27/10; H01L 29/00
[52] U.S. Cl. ........................... 257/530; 257/50; 257/209
[58] Field of Search .................................... 257/208, 209, 257/211, 529, 530, 50

[56] References Cited

U.S. PATENT DOCUMENTS

| | | | |
|---|---|---|---|
| 4,651,409 | 3/1987 | Ellsworth et al. | 29/576 |
| 4,748,490 | 5/1988 | Hollingsworth | 357/51 |
| 4,796,075 | 1/1989 | Whitten | 357/51 |

(List continued on next page.)

FOREIGN PATENT DOCUMENTS

| | | |
|---|---|---|
| 0414361 | 2/1991 | European Pat. Off. . |
| 0416903 | 3/1991 | European Pat. Off. . |
| 0455414 | 4/1991 | European Pat. Off. . |
| 0452091 | 10/1991 | European Pat. Off. . |
| 0500034 | 8/1992 | European Pat. Off. . |
| 0501120 | 9/1992 | European Pat. Off. . |
| 0528417 | 2/1993 | European Pat. Off. . |
| 0539197 | 4/1993 | European Pat. Off. . |
| 2367352 | 10/1977 | France . |
| 2222024 | 2/1990 | United Kingdom . |
| 8700969 | 7/1986 | WIPO . |
| 8702827 | 10/1986 | WIPO . |
| 9213359 | 1/1992 | WIPO . |
| 9220109 | 4/1992 | WIPO . |
| 9303499 | 7/1992 | WIPO . |
| 92020109 | 11/1992 | WIPO ................................. 257/530 |
| 93/05514 | 3/1993 | WIPO . |
| 93/04499 | 3/1993 | WIPO . |

OTHER PUBLICATIONS

Burns, et al., "Titanium Dioxide Dielectric Films Formed by Rapid Thermal Oxidation", J. Appl. Phys. 65(5), Mar. 1, 1989, pp. 2095–2097.

Cohen et al., "A Flat-Aluminum Based Voltage-Programmable Link for Field-Programmable Devices", IEEE Transactions on Electron Devices, vol. 41, No. 5, May 1994, pp. 721–724.

Gordon et al., "Conducting Filament of the Programmed Metal Electrode Amorphous Silicon Antifuse", 1993 IEEE, IEDM, pp. 93-27 to 93-30.

Hu, C., "Interconnect Devices for Field programmable Gate Array", 1992 IEEE, IEDM, pp. 92-591 to 92-594.

Pauleau, Y., "Interconnect Materials for VLSI Circuits", Solid State Technology, Apr., 1987, pp. 155–162.

Primary Examiner—Mahshid Saadat
Assistant Examiner—Valencia Martin Wallace
Attorney, Agent, or Firm—D'Alessandro & Ritchie

[57] ABSTRACT

A method for fabricating a metal-to-metal antifuse comprises the steps of (1) forming and defining a first metal interconnect layer; (2) forming an interlayer dielectric layer; (3) forming an antifuse via in the interlayer dielectric layer to expose the first metal interconnect layer; (4) depositing a via metal layer into a portion of the volume defining the antifuse via; (5) forming a planarizing layer of an insulating material in the antifuse via sufficient to fill a remaining portion of the volume defining the antifuse via; (6) etching the planarizing layer to expose an upper surface of the via metal layer and an upper surface of the interlayer dielectric layer so as to form a substantially planar surface comprising the upper surface of the interlayer dielectric layer, the planarizing layer, and the upper surface of the via metal layer; (7) forming an antifuse material layer over the substantially planar surface; (8) forming a metal capping layer over the antifuse material layer; and (9) defining the antifuse material layer and the metal capping layer.

26 Claims, 8 Drawing Sheets

U.S. PATENT DOCUMENTS

| | | | |
|---|---|---|---|
| 4,822,753 | 4/1989 | Pintchovski et al. | 437/192 |
| 4,847,732 | 7/1989 | Stopper et al. | 361/395 |
| 4,870,302 | 9/1989 | Freeman | 307/465 |
| 4,899,205 | 2/1990 | Hamdy et al. | 357/51 |
| 4,914,055 | 4/1990 | Gordon et al. | 437/192 |
| 4,920,072 | 4/1990 | Keller et al. | 437/192 |
| 4,933,576 | 6/1990 | Tamamura et al. | 307/465 |
| 4,943,538 | 7/1990 | Mohsen et al. | 437/52 |
| 5,070,384 | 12/1991 | McCollum et al. | 357/51 |
| 5,093,711 | 3/1992 | Hirakawa | 357/71 |
| 5,095,362 | 3/1992 | Roesner | 357/23.4 |
| 5,100,827 | 3/1992 | Lytle | 437/52 |
| 5,120,679 | 6/1992 | Boardman et al. | 437/195 |
| 5,134,457 | 7/1992 | Hamdy et al. | 357/51 |
| 5,166,556 | 11/1992 | Hsu et al. | 307/465 |
| 5,171,715 | 12/1992 | Husher et al. | 437/195 |
| 5,194,759 | 3/1993 | El-Ayat et al. | 307/202.1 |
| 5,196,724 | 3/1993 | Gordon et al. | 257/530 |
| 5,233,206 | 8/1993 | Lee et al. | 257/50 |
| 5,233,217 | 8/1993 | Dixit et al. | 257/530 |
| 5,241,496 | 8/1993 | Lowrey et al. | 365/96 |
| 5,242,851 | 9/1993 | Choi | 437/49 |
| 5,248,632 | 9/1993 | Tung et al. | 437/195 |
| 5,266,829 | 11/1993 | Hamdy et al. | 257/530 |
| 5,270,251 | 12/1993 | Cohen | 437/173 |
| 5,272,101 | 12/1993 | Forouhi et al. | 437/44 |
| 5,272,666 | 12/1993 | Tsang et al. | 365/96 |
| 5,284,788 | 2/1994 | Spratt et al. | 437/52 |
| 5,286,993 | 2/1994 | Lowrey et al. | 257/390 |
| 5,290,734 | 3/1994 | Boardman et al. | 437/195 |
| 5,298,784 | 3/1994 | Gambino et al. | 257/529 |
| 5,300,456 | 4/1994 | Tigelaar et al. | 257/50 |
| 5,302,546 | 4/1994 | Gordon et al. | 437/170 |
| 5,304,508 | 4/1994 | Cohen | 437/170 |
| 5,308,795 | 5/1994 | Hawley et al. | 437/195 |
| 5,322,812 | 6/1994 | Dixit et al. | 437/60 |
| 5,327,024 | 7/1994 | Cox | 307/465 |
| 5,328,865 | 7/1994 | Boardman et al. | 437/60 |
| 5,329,153 | 7/1994 | Dixit | 257/530 |
| 5,332,929 | 7/1994 | Chiang | 307/296.3 |
| 5,353,246 | 10/1994 | Tsang et al. | 365/96 |
| 5,381,035 | 1/1995 | Chen et al. | 257/530 |
| 5,387,311 | 2/1995 | Hall et al. | 156/630 |
| 5,390,141 | 2/1995 | Cohen et al. | 365/96 |
| 5,391,513 | 2/1995 | Delgado et al. | 437/60 |
| 5,391,518 | 2/1995 | Bhushan | 437/190 |
| 5,395,797 | 3/1995 | Chen et al. | 437/195 |
| 5,403,778 | 4/1995 | Kwok et al. | 437/188 |
| 5,404,029 | 4/1995 | Husher et al. | 257/50 |
| 5,412,245 | 5/1995 | Favreau | 257/530 |
| 5,412,593 | 5/1995 | Magel et al. | 365/96 |
| 5,482,884 | 1/1996 | McCollum et al. | 437/60 |
| 5,485,031 | 1/1996 | Zhang et al. | 257/530 |

ABOVE VIA METAL-TO-METAL ANTIFUSE

CROSS-REFERENCE TO RELATED APPLICATIONS

This is a file-wrapper continuation of patent application Ser. No. 08/122,747, filed Sep. 17, 1993, now abandoned which is a division of co-pending application Ser. No. 07/971,734, filed Nov. 5, 1992. U.S. Pat. No. 5,301,232.

BACKGROUND OF THE INVENTION

1. Field of the Invention

The present invention relates to user-programmable antifuse technology. More particularly, the present invention relates to metal-to-metal antifuses and to above-via metal-to-metal antifuses.

2. The Prior Art

In the practice of antifuse fabrication technology, it has been found that scaling problems occur when depositing antifuse material, such as PECVD amorphous silicon, into via openings having depths greater than about 0.4 microns and widths narrower than about 1.0 microns. These scaling problems consist of reduced antifuse breakdown voltage and uniformity and increased current leakage in the antifuse structure. As the depth/width aspect ratio of the antifuse via increases, the scaling problems get worse. This is due to the reduced step coverage (final thickness) of the antifuse material at the bottom of the antifuse via. As the antifuse via depth increases and or the width gets smaller, step coverage of most deposited films gets worse and the scaling problems increase. If the antifuse material layer is thickened to obtain higher breakdown voltage, a problem develops with the top electrode. Because the via is even smaller after the antifuse material layer is deposited, it becomes very hard to deposit enough upper electrode material into the via to ensure it will be reliable.

For example, if about 1,000 angstroms of amorphous silicon antifuse material (for a 10 volt antifuse breakdown voltage value) is required in the bottom of the via and the step coverage into a via having an initial size of 0.8 microns is 60%, the amorphous silicon deposition thickness required will be 0.18, so the sidewall coverage of the via at its thickest point at the top of the via will be about 0.18 microns. The resulting reduced-size via available for metal deposition is then roughly 0.8−0.36=0.44 microns wide. When depositing the top metal electrode into this 0.44 micron wide via, the amount of metal which can be deposited is limited by the fact that the via tends to close off during the deposition process, leaving a partial void. If the via is 0.44 microns, only 0.22 microns of metal may be deposited on the via sides before the via closes off. At about 50% step coverage inside the via, the 0.22 microns/side top electrode metal is about 0.11 microns thick at its thinnest point on the sidewall of the via. Because the via is now closed off, there is no room left for any interconnect metal to get into the via and the reliability of about 0.11 microns of top electrode as an interconnect may be a concern.

As those of ordinary skill in the art will appreciate, when this process is scaled to a via of 0.6 microns, and 0.2 microns/side of amorphous silicon is deposited (0.2 microns at 50% step coverage=0.1 microns at the bottom of the via, a reduced step coverage as via gets smaller) there is only 0.6−0.4=0.2 microns via left into which to deposit the top electrode. Now only 0.1 micron/side of top electrode can be deposited before the via closes off and, at 40% step coverage (step coverage is less due to smaller via size), there will be about 400 angstroms of top electrode as metal interconnect to the antifuse material at the thinnest point on the via sidewall. This 400 angstroms of interconnection to the antifuse in the via is a big reliability concern.

BRIEF DESCRIPTION OF THE INVENTION

According to a first aspect of the present invention, a method for fabricating a metal-to-metal antifuse comprises the steps of (1) forming and defining a first metal interconnect layer; (2) forming an interlayer dielectric layer; (3) forming an antifuse via in the interlayer dielectric layer to expose the first metal interconnect layer; (4) depositing a via metal layer into a portion of the volume defining the antifuse via; (5) forming a planarizing layer of an insulating material in the antifuse via sufficient to fill a remaining portion of the volume defining the antifuse via; (6) etching the planarizing layer to expose an upper surface of the via metal layer and an upper surface of the interlayer dielectric layer so as to form a substantially planar surface comprising the upper surface of the interlayer dielectric layer, the planarizing layer, and the upper surface of the via metal layer; (7) forming an antifuse material layer over the substantially planar surface; (8) forming a metal capping layer over the antifuse material layer; and (9) defining the antifuse material layer and the metal capping layer, The method may include the steps of forming a spacer on sidewalls of the antifuse material layer and the metal capping layer; and forming and defining a second metal interconnect layer over the metal capping layer.

According to a second aspect of the present invention, a method for fabricating a metal-to-metal antifuse comprises the steps of (1) forming and defining a first metal interconnect layer; (2) forming an interlayer dielectric layer; (3) forming an antifuse via in the interlayer dielectric layer to expose the first metal interconnect layer; (4) depositing and defining a via metal layer into a portion of the volume defining the antifuse via; (5) forming a planarizing layer of an insulating material in the antifuse via sufficient to fill a remaining portion of the volume defining the antifuse via; (6) etching the planarizing layer to form a planar surface on an upper surface of the via metal layer and to form spacers at the edges of the via metal layer; (7) forming an antifuse material layer over the substantially planar surface; (8) forming a metal capping layer over the antifuse material layer; (9) defining the antifuse material layer and the metal capping layer; and (10) forming spacers at the edge of the antifuse and metal layers.

According to a third aspect of the present invention, a method for fabricating a metal-to-metal antifuse comprises the steps of (1) forming and defining a first metal interconnect layer; (2) forming an interlayer dielectric layer; (3) forming an antifuse via in the interlayer dielectric layer to expose the first metal interconnect layer; (4) depositing a via metal layer into a portion of the volume defining the antifuse via; (5) forming a planarizing layer of an insulating material in the antifuse via sufficient to fill a remaining portion of the volume defining the antifuse via; (6) etching the planarizing layer to expose an upper surface of the via metal layer so as to form a substantially planar surface comprising the upper surface of the via metal layer; (7) forming an antifuse material layer over the substantially planar surface; (8) defining tile antifuse material layer and the metal capping layer, and (9) forming spacers around the edges of the metal capping layer over the antifuse material layer.

According to a fourth aspect of the present invention, a method for fabricating a metal-to-metal antifuse comprises the steps of (1) forming and defining a first metal interconnect layer; (2) forming an interlayer dielectric layer; (3) forming an antifuse via in the interlayer dielectric layer to expose the first metal interconnect layer; (4) depositing a via metal layer into a portion of the volume defining the antifuse via; (5) forming a planarizing layer of an insulating material in the antifuse via sufficient to fill a remaining portion of the volume defining the antifuse via; (6) etching the planarizing layer to expose an upper surface of the via metal layer so as to form a substantially planar surface comprising the upper surface of the via metal layer; (7) forming a conductive layer over the planar surface; (8) defining the conductive layer and the via metal layer; (9) forming an additional dielectric layer and forming an antifuse aperture therein to expose the conductive layer; (10) forming an antifuse material layer over the additional dielectric layer in the antifuse via therein; (11) forming a metal capping layer over the antifuse material layer; (12) defining the antifuse material layer and the metal capping layer; and (13) forming spacers around the edges of the antifuse material layer and the metal capping layer. The method may include the steps of forming a spacer on sidewalls of the antifuse material layer and the metal capping layer; and forming and defining a second metal interconnect layer over the metal capping layer.

According to a fifth aspect of the present invention, a method for fabricating a metal- to-metal antifuse comprises the steps of (1) forming and defining a first metal interconnect layer; (2) forming an interlayer dielectric layer; (3) forming an antifuse via in the interlayer dielectric layer to expose the first metal interconnect layer; (4) depositing a via metal layer into a portion of the volume defining the antifuse via; (5) forming a planarizing layer of an insulating material in the antifuse via sufficient to fill a remaining portion of the volume defining the antifuse via; (6) etching the planarizing layer to expose an upper surface of the via metal layer and an upper surface of the interlayer dielectric layer so as to form a substantially planar surface comprising the upper surface of the interlayer dielectric layer, the planarizing layer, and the upper surface of the via metal layer; (7) forming a conductive layer over the substantially planar surface (8) forming an antifuse material layer over the conductive layer; (9) forming a metal capping layer over the antifuse material layer; and (10) defining the conductive layer, the antifuse material layer and the metal capping layer. The method may include the steps of forming a spacer on sidewalls of the antifuse material layer and the metal capping layer; and forming and defining a second metal interconnect layer over the metal capping layer.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Figure 1:
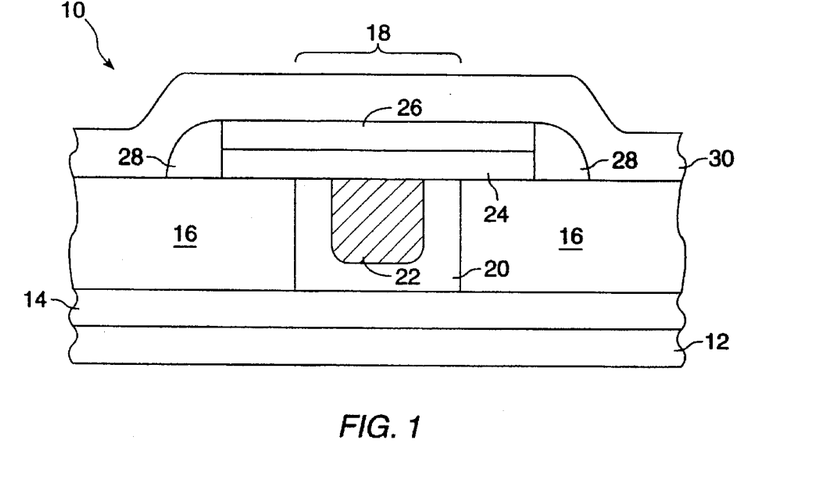
FIG. 1 is a cross-sectional view of an above-via antifuse structure according to a first embodiment of the present invention.

Referring first to FIG. 1, a cross-sectional view of the structure of an above-via antifuse 10 according to a first embodiment of the invention is shown. Antifuse 10 is formed on a substrate 12. Substrate 12 may comprise an insulating substrate or an insulating layer formed over a conductive or semiconductor substrate. A lower antifuse electrode 14 is disposed over the substrate 12 using standard deposition techniques. Lower antifuse electrode 14 may comprise a sandwich structure of TiW/AlSiCuFFiW, and may be a portion of a metal interconnect layer in an integrated circuit or other microcircuit.

An interlayer dielectric layer 16 is disposed over lower antifuse electrode 14 and may comprise, for example, PECVD silicon dioxide. An antifuse via 18 is then patterned and etched in the interlayer dielectric layer 16 to expose the upper surface of lower antifuse electrode 14.

Normally, a layer of antifuse material would next be formed in antifuse via 18 at this stage of a conventional antifuse fabrication process, and an upper electrode would be formed over tile layer of antifuse material to complete the antifuse structure.

The structure of the antifuse of the present invention is different, and may be referred to as an "above-via" antifuse because of its structure. A layer of a conductive material 20, such as TiW, is formed in tile antifuse via 18. Those of ordinary skill in tile art will recognize that, due to the depth and aspect ratio of the antifuse via 18 a void will be unoccupied by conductive material 20. According to the present invention, a layer of planarizing material, such as spin-on glass (SOG) is deposited on the surface of the structure and a portion of planarizing material 22 fills the void volume. The surface of the planarizing material 22 and the conductive material 20 is then planarized to the surface of the interlayer dielectric layer 16 using appropriate etching techniques.

An antifuse material layer 24 is formed over the planarized surface of the conductive material 20 and planarizing material 22 in the antifuse via 18. According to a presently preferred embodiment of the invention, antifuse material layer 24 may comprise a single layer of amorphous silicon. Alternatively, antifuse material layer 24 may comprise a composite layer of silicon nitride, silicon nitride/ amorphous silicon, amorphous silicon/silicon nitride, silicon nitride/amorphous silicon/silicon nitride, amorphous silicon/ silicon nitride amorphous silicon, silicon dioxide/silicon nitride, silicon nitride/silicon dioxide, silicon nitride/silicon dioxide/silicon nitride, or silicon dioxide/silicon nitride/ silicon dioxide. This is not an exhaustive list for the composition of antifuse material layer 24, and those of ordinary skill in the art will be able to substitute other appropriate materials.

An upper antifuse electrode 26 is formed over the antifuse material layer 24. This upper antifuse electrode 26 may be formed from a material such as TiW, Ti, TiN, or TiW:N and thus also serves as a barrier layer to prevent contamination of the antifuse material layer 24 from atoms in overlying the metal layer. The stacked structure comprising antifuse material layer 24 and upper antifuse electrode 26 are patterned and defined using conventional processing technology and spacers 28 are formed at the edges of the stacked structure. Spacers 28 may be formed by depositing and etching back an oxide layer.

Finally, an upper metal interconnect layer 30 is formed over the upper antifuse electrode 26. Spacers 28 act to ease the conformality problem which would otherwise exist at the edges of the stacked structure.

Figure 2A:
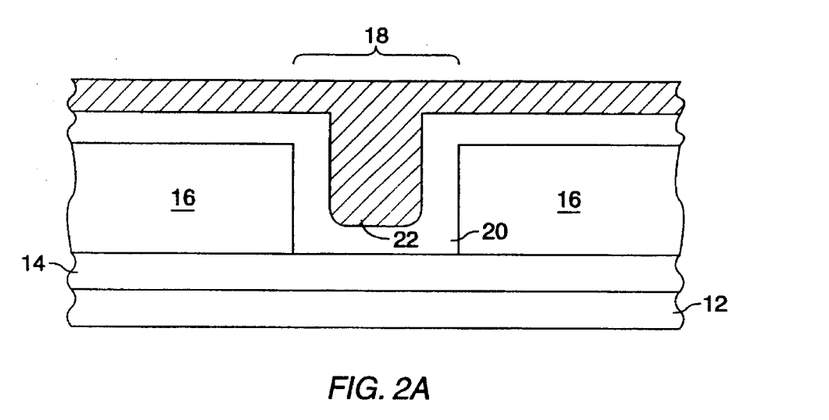
FIGS. 2a–2e are cross-sectional views of tile antifuse structure of FIG. 1 at various stages during the progression of the fabrication process.

Referring now to FIGS. 2a–2e, cross-sectional views are shown of the antifuse 10 of FIG. 1 after completion of certain of the steps in the fabrication process in order to illustrate the fabrication process. Referring first to FIG. 2a, the structure is shown after formation of the lower antifuse electrode 14, interlayer dielectric layer 16 and antifuse via 18, conductive material 20, and planarizing material 22. Lower antifuse electrode 14 may be a first metal interconnect layer and is preferably formed from TiW/AlSiCuTTiW to a thickness of about 3,000 angstroms, 4,500 angstroms, and 1,000 angstroms, top layer to bottom layer, respectively. Interlayer dielectric layer 16 will typically be a layer of PECVD silicon dioxide having a thickness of about 8,000 angstroms and a typical antifuse via 18 may have dimensions of 0.8 microns by 0.8 microns. Conductive material 20 preferably comprises a TiW layer having a thickness of between about 2,000 to 6,000 angstroms, preferably about 3,000 angstroms.

As will be understood by those of ordinary skill in the art, spin-on glass (SOG) is a commonly-used planarizing layer. It is a self-planarizing film that thins down over high points and fills deep pockets or height differential steps. It is applied as a liquid to the wafer and spreads out over the surface of the wafer as the wafer is spun. According to a presently preferred embodiment of the invention, the SOG planarizing layer is deposited to a thickness of between about 1,000 to 4,000 angstroms, preferably about 2,500 angstroms. A double spin step may be used, if necessary, to achieve adequate planarization.

Figure 2B:
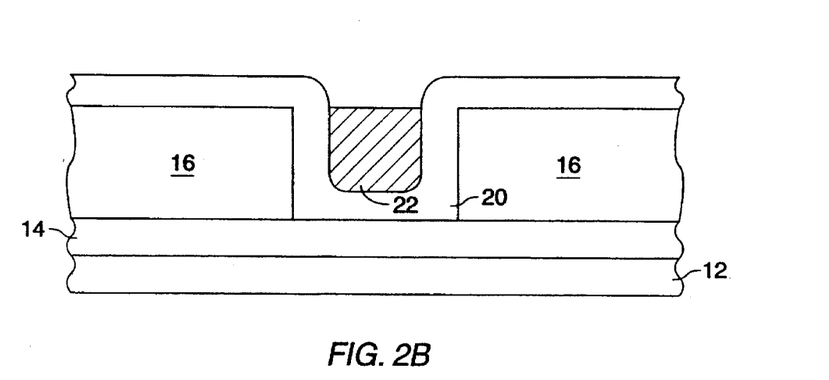

FIG. 2b shows the structure resulting after the planarizing material 22 has been etched back to be even with the surface of interlayer dielectric layer 16. For an SOG planarizing layer, a standard oxide-type etch, such as $CHF_3$ gas is used to etch back 4,000 angstroms of the SOG layer with a 40% overetch.

Figure 2C:
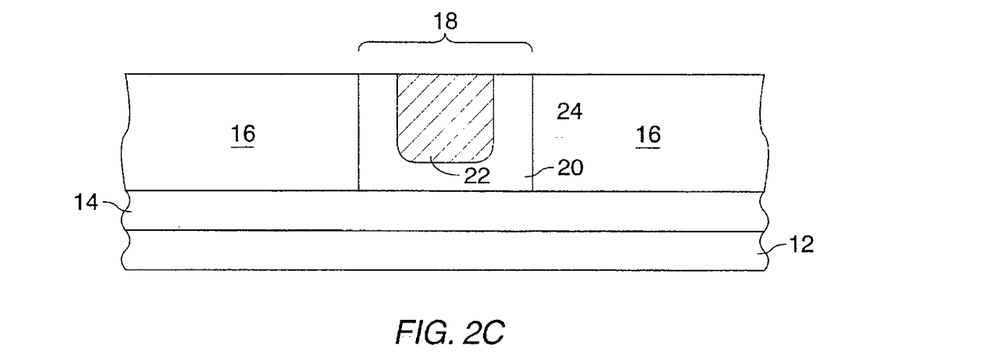

Next, as shown in FIG. 2c, the TiW conductive material 20 is etched back using a standard TiW type etching process. As presently preferred, a $CF_4/O_2$ or $SF_6/Ar$ gas chemistry etch may be utilized to etch bach the Ti W layer 3,000 angstroms witit a 30% overetch. This will leave the material in antifuse via 18 planarized level with the top surface of the interlayer dielectric layer 16 and leaves the conductive material shaped like a cup having a conductive rim as shown In situations involving deep or high aspect-ratio vias, a first SOG etch-back step may be followed by a second spin-on application and a second etch-back step to completely fill the void left by the incomplete filling of antifuse via 18 with conductive material 20.

Figure 2D:
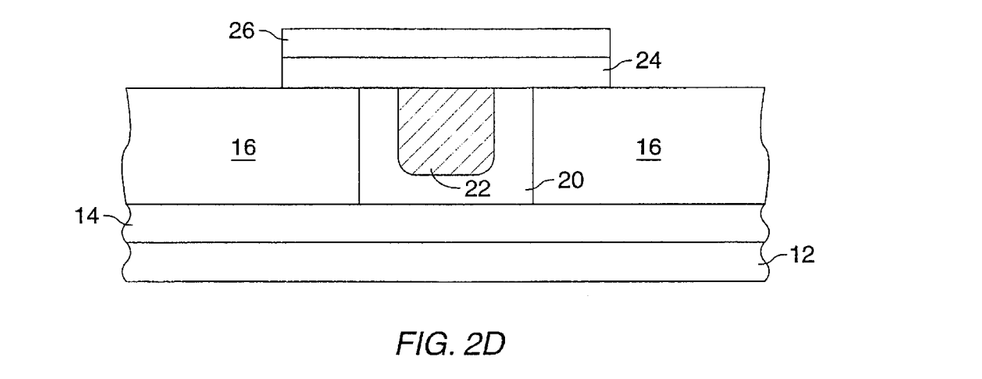

Referring now to FIG. 2d, the antifuse 10 structure is shown after formation and definition of antifuse material layer 24 and upper antifuse electrode 26. As previously mentioned, antifuse material layer 24 may be formed from a variety of materials and thicknesses, depending upon the desired programming and other electrical characteristics desired for the finished antifuse. As previously stated, upper antifuse electrode 26 may be formed from a material such as TiW, Ti, TiN, or TiW:N and thus also serves as a capping or barrier layer to prevent contamination of the antifuse material layer 24 from atoms in overlying the metal layer. A typical thickness for upper antifuse electrode 26 may be between about 500 to 3,000 angstroms, preferably about 3,000 angstroms. FIG. 2d shows the structure resulting after the stack of layers 24 and 26 have been defined by conventional masking and etching steps and the masking layer has been removed.

Figure 2E:
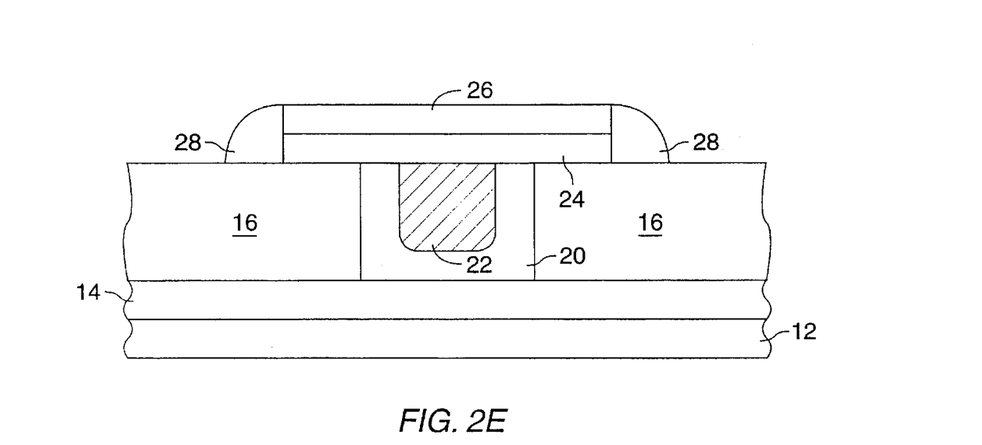

Referring now to FIG. 2e, spacers 28 have been formed around the periphery of the stack of layers 24 and 26 in order to minimize any step coverage problems for the second metal interconnect layer which will next be formed over the upper antifuse electrode 26. The spacers 28 are preferably formed from a layer of silicon dioxide which is deposited to a thickness of about 4,000 angstroms and then etched back to leave the spacers 28. Those of ordinary skill in the art will be familiar with processing steps for forming spacers 28.

The antifuse shown in FIG. 2e is essentially complete. A final step in the fabrication process usually comprises forming an upper metal interconnect layer 30 in contact with the upper antifuse electrode 26, although those of ordinary skill in the art will recognize that an insulating layer may be formed over the upper antifuse electrode 26 and a contact via may be formed thererin to make contact to the upper antifuse electrode 26 from an overlying conductive layer. Such skilled persons will also recognize that the formation of the upper metal intercorect is preceded by formation of inter-metal contact vias. The finished structure is depicted in FIG. 1.

The antifuse 10 according to the first embodiment of the present invention may be fabricated with two masks, one to create the antifuse via 18 and one to define the stacked antifuse material layer 24 and upper antifuse electrode 26. The antifuse 10 of this embodiment of the invention eliminates the topography problems encountered in metal-to-metal antifuses, including depositing the antifuse material layer 24 in the antifuse via 18 and dealing with the step coverage issues which cause non-uniform breakdown. The antifuse 10 of the present invention also eliminates locating the antifuse stack on top of the first metal layer where the planarization of the interlayer dielectric and the etch of the first metal interconnect layer become issues.

The antifuse 10 according to this embodiment of the invention has a very low capacitance due to the small area where the bottom of the antifuse 10 is in contact with the via TiW. This means that it will have a lower leakage and allow higher speed and lower power requirements in products containing it.

Figure 3:
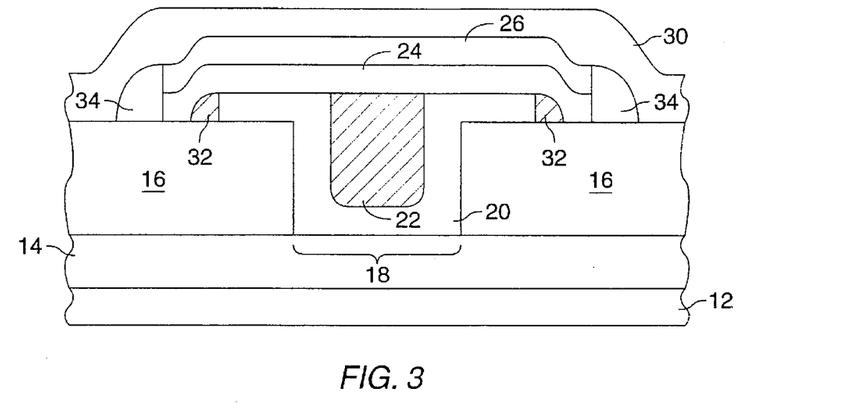
FIG. 3 is a cross-sectional view of an above-via antifuse structure according to a second embodiment of the present invention.

Referring now to FIG. 3, a second embodiment of an antifuse structure according to the present invention is shown in cross-section. Like the antifuse 10 illustrated in FIG. 1, the antifuse of FIG. 3 is formed over a substrate 12 and a lower antifuse electrode 14 which may comprise a metal interconnect layer in an integrated circuit. An interlayer dielectric layer 16 is formed and an antifuse via 18 is formed in therein by conventional masking and etching techniques. A layer of conductive material 20 is formed in antifuse via 18 and a planarizing layer 22 is formed in the void remaining in the antifuse via 18 after the conductive material 20 has been formed therein.

Unlike the embodiment of FIG. 1, wherein the conductive materials 20 and the planarizing material 22 are planarized to the upper surface of the interlayer dielectric layer 16, the conductive material in the antifuse of FIG. 3 is first defined prior to application of the SOG planarizing layer. As a result, when the planarizing material 22 is etched back, spacers 32 are formed at the edges of conductive material 20. A stack comprising antifuse material layer 24 and upper antifuse electrode 26 are disposed over the defined conductive material 20 and spacers 32. This stack is defined and spacers 34 are formed at the edges of the stack. An upper metal interconnect layer 30 is preferably disposed over the upper antifuse electrode 26.

Referring now to FIGS. 4a–4e, cross-sectional views are shown of the antifuse of FIG. 3 after completion of certain of the steps in the fabrication process in order to illustrate the fabrication process. The layer thicknesses and material employed in the antifuse of FIG. 3 may be the same as those employed in the antifuse of FIG. 1.

Figure 4A:
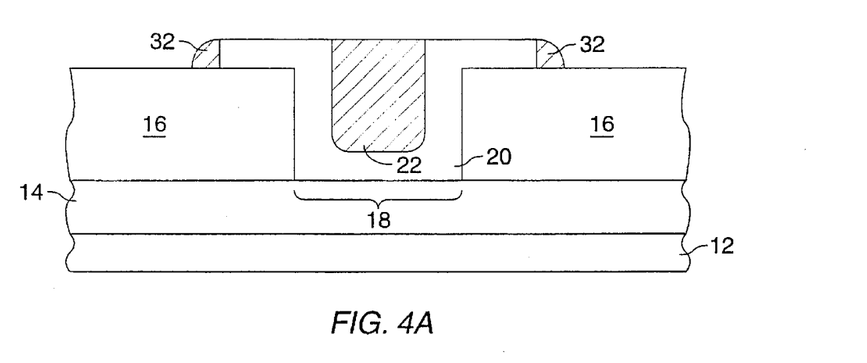
FIGS. 4a–4c are cross-sectional views of the antifuse structure of FIG. 3 at various stages during the progression of the fabrication process.

Referring first to FIG. 4a, the structure is shown after formation of the lower electrode antifuse 14, interlayer dielectric layer 16 and antifuse via 18. Conductive material 20 has been formed and defined using conventional deposition, masking and etching steps, and planarizing material 22 has been placed on the surface of the structure and etched back to form a surface planar with the upper surface of conductive material 20. The etch-back process also advantageously forms spacers 32 at the edges of conductive material 20. In situations involving deep or high aspect-ratio vias, a first SOG etch-back step may be followed by a second spinon application and a second etch-back step to completely fill the void left by the incomplete filling of antifuse via 18 with conductive material 20.

Figure 4B:
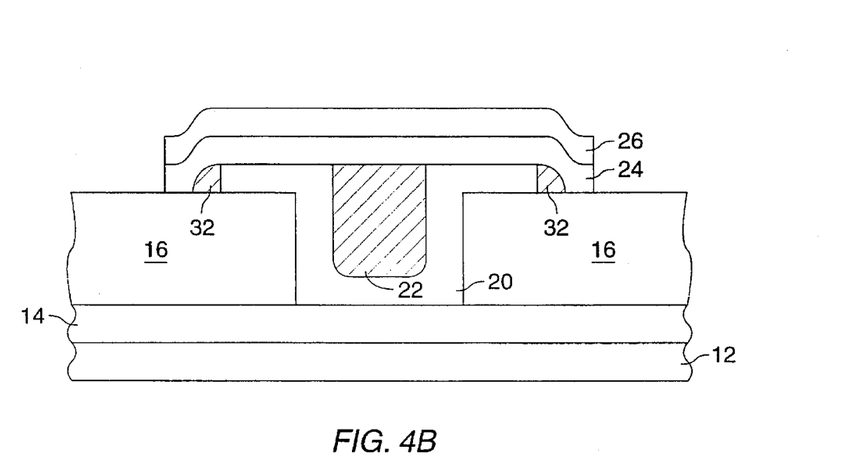

FIG. 4b shows the structure resulting after the stack comprising antifuse material layer 24 and upper antifuse electrode 26 have been formed and defined using conventional deposition, masking, and etching steps. In FIG. 4b, the masking layer for defining the stack has already been removed.

Figure 4C:
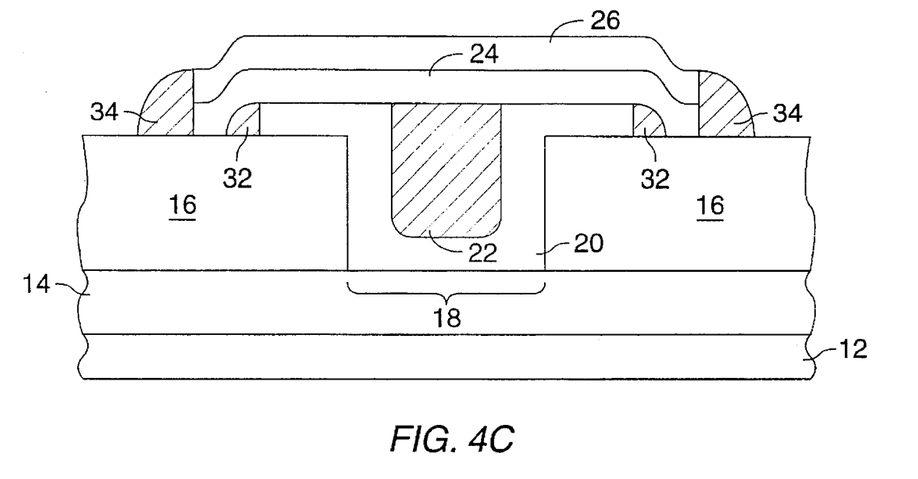

Next, as shown in FIG. 4c, spacers 34 are formed at the edges of the stack structure, preferably by using the known technique of first depositing and then etching back a silicon dioxide layer. The presence of spacers 34 improve the step coverage when later depositing upper metal interconnect layer 30. The finished structure, after deposition and definition of upper metal intercorrect layer 30, is depicted in FIG. 3.

The antifuse according to the second embodiment of the present invention may be fabricated with three masks, one to create the antifuse via 18, one to define the conductor material 20, and one to define the stacked antifuse material layer 24 and upper antifuse electrode 26. The antifuse of this embodiment of the invention also eliminates the topography problems encountered in metal-to-metal antifuses, including depositing the antifuse material layer 24 in the antifuse via 18, dealing with the step coverage issues which cause non-uniform breakdown, and eliminating placement of the antifuse stack on top of the first metal layer where the planarization of the interlayer dielectric and the etch of the first metal interconnect layer become issues.

Figure 5:
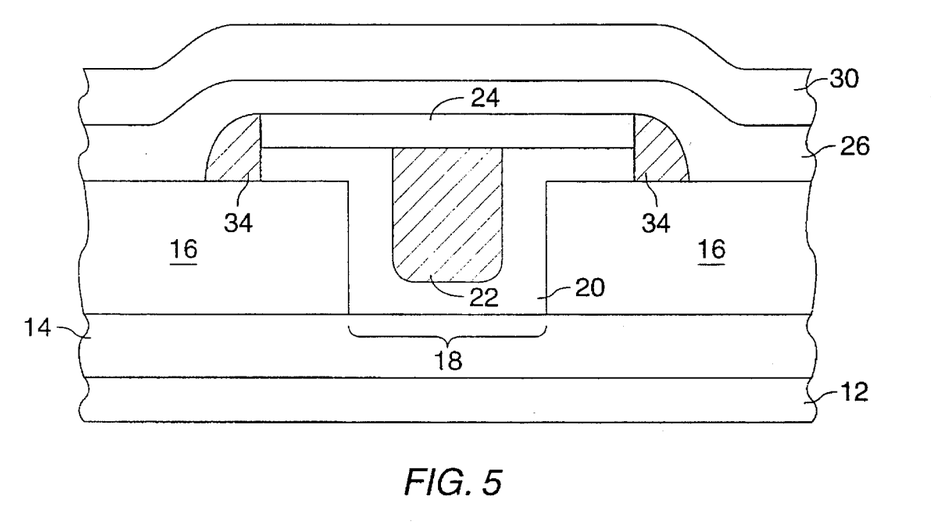
FIG. 5 is a cross-sectional view of an above-via antifuse structure according to a third embodiment of the present invention.

Referring now to FIG. 5, an antifuse structure according to a third embodiment of the invention is shown in cross-sectional view. Like the antifuse illustrated in FIGS. 1 and 3, the antifuse of FIG. 5 is formed over a substrate 12 and a lower antifuse electrode 14 which may comprise a metal interconnect layer in an integrated circuit. An interlayer dielectric layer 16 is formed and an antifuse via 18 is formed in therein by conventional masking and etching techniques. A layer of conductive material 20 is formed in antifuse via 18 and a planarizing material 22 is formed in the void remaining in the antifuse via 18 after the conductive material 20 has been formed therein. An antifuse material layer 24 is disposed over the planarized surface. The stacked structure comprising antifuse material layer 24 and conductive material 20 are patterned and etched using conventional processing techniques. The edges of the antifuse material layer 24 are aligned to the edges of the conductive material 20 layer and are aligned to one another. Oxide spacers 34 are formed at the edges of the conductive material 20 layer and the antifuse material layer 24. The upper antifuse electrode 26 and the second upper metal interconnect layer 30 are disposed over the antifuse material layer 24 and spacers 34.

Referring now to FIGS. 6a–6e, cross-sectional views are shown of the antifuse of FIG. 5 after completion of certain of the steps in the fabrication process in order to illustrate the fabrication process. The layer thicknesses and material employed in the antifuse of FIG. 5 may be tile same as those employed in tile antifuses of FIG. 1 and FIG. 3.

Figure 6A:
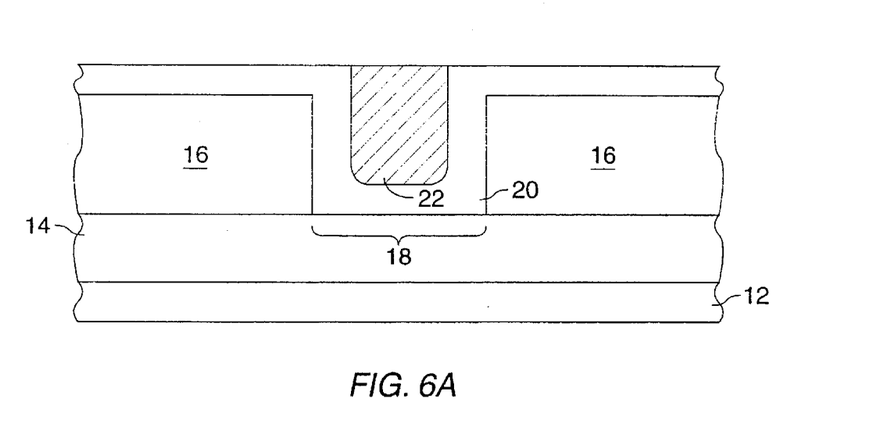
FIGS. 6a–6d are cross-sectional views of the antifuse structure of FIG. 5 at various stages during the progression of the fabrication process.

Referring first to FIG. 6a, the structure is shown after formation of the lower antifuse electrode 14, interlayer dielectric layer 16 and antifuse via 18. Conductive material 20 has been formed using conventional deposition steps, and planarizing material 22 has been placed on the surface of the structure and etched back to form a surface planar with the upper surface of conductive material 20. In situations involving deep or high aspect-ratio vias, a first SOG etch-back step may be followed by a second spin-on application and a second etch-back step to completely fill the void left by the incomplete filling of antifuse via 18 with conductive material 20.

Figure 6B:
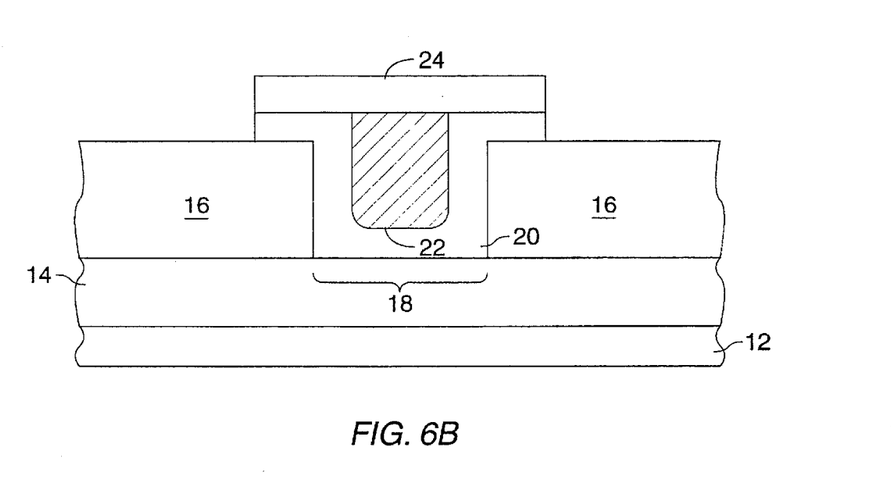

Referring now to FIG. 6b, the antifuse material layer 24 is deposited and stack comprising antifuse material layer 24 and conductive material 20 have been formed and defined using conventional deposition, masking, and etching steps. In FIG. 6b, the masking layer for defining the stack has already been removed and it can be seen that the edges of antifuse material layer 24 and conductive material 20 are aligned.

Figure 6C:
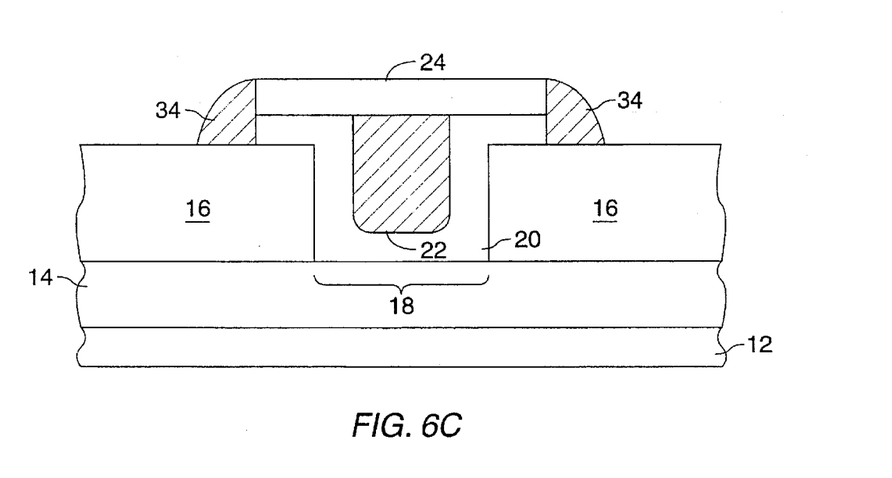

Next, as shown in FIG. 6c, spacers 34 are formed at the edges of the stack structure, preferably by using the known technique of first depositing and then etching back a silicon dioxide layer. The presence of spacers 34 prevent the conductive material 20 from short circuiting to the upper antifuse electrode 26 and improve the step coverage when later depositing upper metal interconnect layer 30.

Figure 6D:
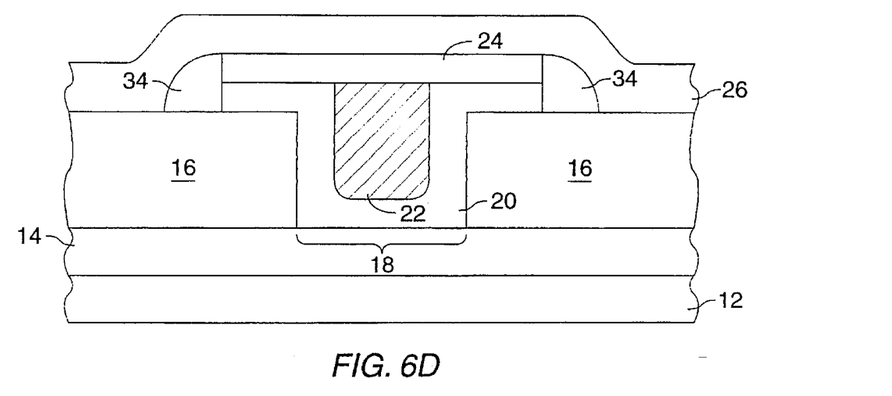

Referring now to FIG. 6d, upper antifuse electrode 26 is deposited over the exposed surface in contact with antifuse material layer 24. The spacers 34 facilitate step coverage over the stack of conductive material 20 and antifuse material layer 24. The finished structure, after deposition and definition of upper metal interconnect layer 30, is depicted in FIG. 5.

The antifuse according to the third embodiment of the present invention may be fabricated with two masks, one to create the antifuse via 18, and one to define the conductive material 20 and antifuse material layer 24. The antifuse of this embodiment of the invention also eliminates the topography problems encountered in metal-to-metal antifuses, including depositing the antifuse material layer 24 in the antifuse via 18, dealing with the step coverage issues which cause non-uniform breakdown, and eliminating placement of the antifuse stack on top of the first metal layer where the planarization of the interlayer dielectric and the etch of the first metal interconnect layer become issues.

Figure 7:
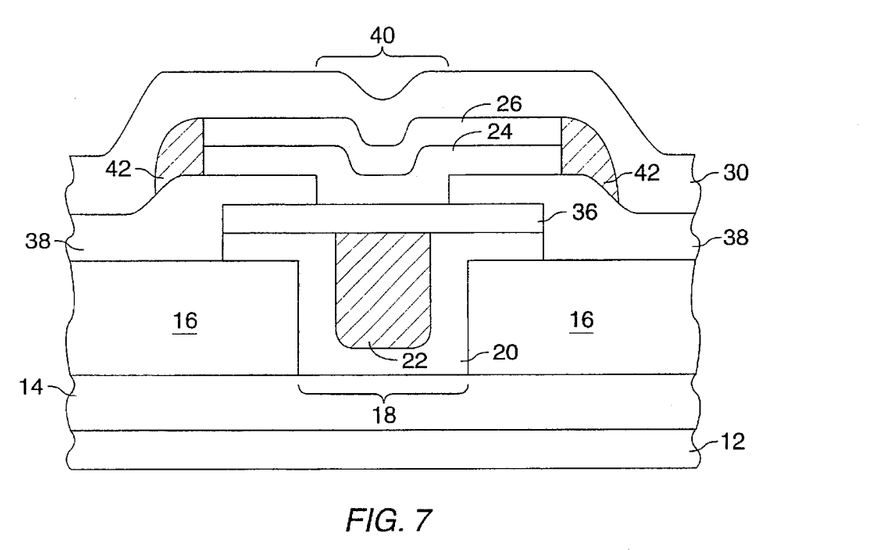
FIG. 7 is a cross-sectional view of an above-via antifuse structure according to a fourth embodiment of the present invention.

Referring now to FIG. 7, an antifuse structure according to a fourth embodiment of the invention is shown in cross-sectional view. Like the antifuse illustrated in FIGS. 1, 3, and 5, the antifuse of FIG. 7 is formed over a substrate 12 and a lower antifuse electrode 14 which may comprise a metal interconnect layer in an integrated circuit. An interlayer dielectric layer 16 is formed and an antifuse via 18 is formed in therein by conventional masking and etching techniques. A layer of conductive material 20 is formed in antifuse via 18 and a planarizing material 22 is formed in the void remaining in the antifuse via 18 after the conductive material 20 has been formed therein.

The structure of the antifuse of FIG. 7 is substantially different from the other antifuse structures of the previously-disclosed embodiments of the present invention. An additional conductive layer 36, preferably formed from TiW, is disposed over the planarized conductive material 20 and aligned therewith. An additional dielectric layer 38, preferably formed from silicon dioxide to a thickness of between about 1,000 to 4,000 angstroms, preferably about 2,000 angstroms, is disposed over the stack of layers 20 and 36 and the interlayer dielectric layer 16. A second antifuse via 40 communicates with the additional conductive layer 36, and an antifuse material layer 24 is disposed in the second antifuse via 40. An upper antifuse electrode 26 is aligned with the edges of antifuse material layer 24. Spacers 42 are disposed at the edges of the stack of layers 24 and 26, and an upper metal interconnect layer 30 is disposed over the top of the structure. Because of the additional dielectric layer 38 and second antifuse 40, the antifuse of FIG. 7 has a smaller capacitance in its unprogrammed state than do the antifuses of FIGS. 3 and 5.

Referring now to FIGS. 8a–8e, cross-sectional views are shown of the antifuse of FIG. 7 after completion of certain of the steps in the fabrication process in order to illustrate the fabrication process. Tile layer thicknesses and materials employed in the antifuse of FIG. 7 may be tile same as those employed for corresponding structures in the antifuses of FIGS. 1, 3, and 5.

Figure 8A:
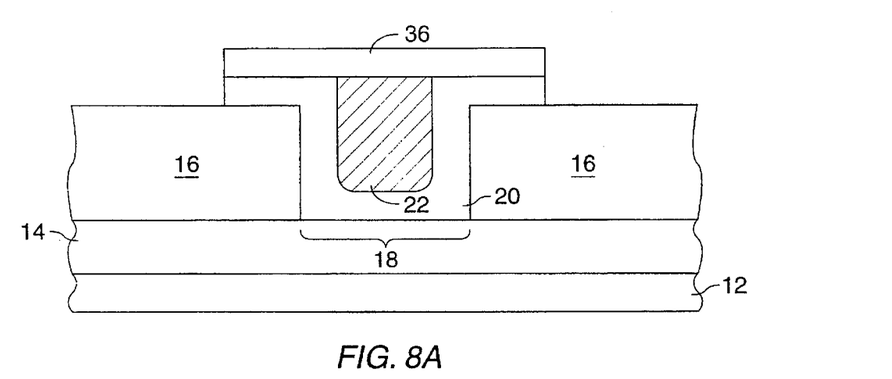
FIGS. 8a–8d are cross-sectional views of the antifuse structure of FIG. 7 at various stages during the progression of the fabrication process.

Referring first to FIG. 8a, the structure is shown after formation of the lower antifuse electrode 14, interlayer dielectric layer 16 and antifuse via 18. Conductive material 20 has been formed using conventional deposition steps, and planarizing material 22 has been placed on the surface of the structure and etched back to form a surface planar with the upper surface of conductive material 20. As with the previous embodiments, a first SOG etch-back step may be followed by a second spin-on application and a second etch-back step to completely fill the void left by the incomplete filling of antifuse via 18 with conductive material 20 in situations involving deep or high aspect-ratio vias. An additional conductive layer 36, preferably comprising a layer of TiW having a thickness of between about 500 angstroms to 3,000 angstroms, preferably about 1,000 angstoms, is deposited over the planarizod surface of the conductive material 20 and the composite stack is defined using conventional masking and etching techniques. FIG. 8a shows the structure resulting after removal of the masking layer used to define the edges of conductive layer 20 and additional conductive material 36.

Figure 8B:
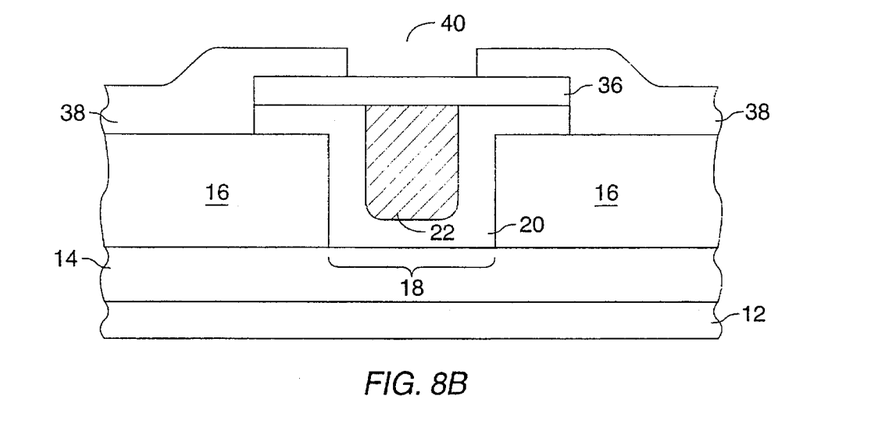

Referring now to FIG. 8b, an additional dielectric layer 38 is formed over the structure depicted in FIG. 8a. A second antifuse via 40 is formed in additional dielectric layer 38. FIG. 8b depicts the structure after the mask used to form second antifuse via 40 has been removed.

Figure 8C:
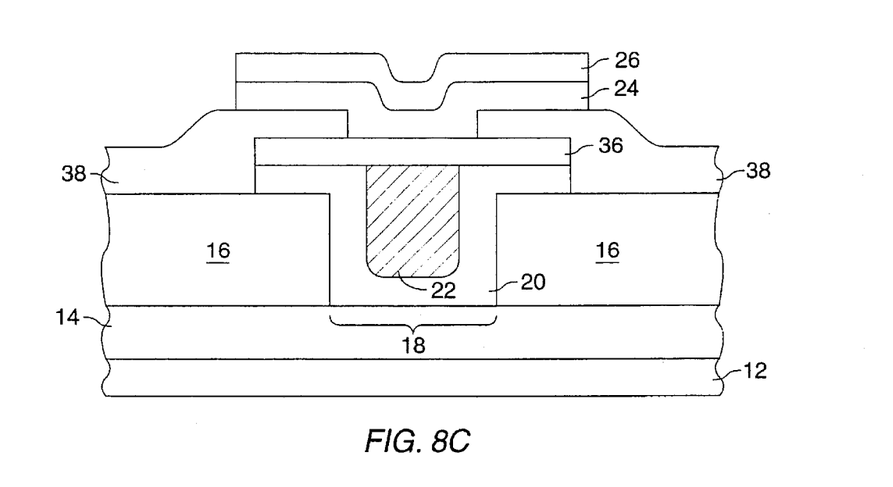

Next, as shown in FIG. 8c, antifuse material layer 24 and upper antifuse electrode 26 are deposited and defined using conventional semiconductor processing techniques. FIG. 8c depicts the structure after the masking layer used to define the edges of antifuse material layer 24 and upper antifuse electrode 26 has been removed.

Figure 8D:
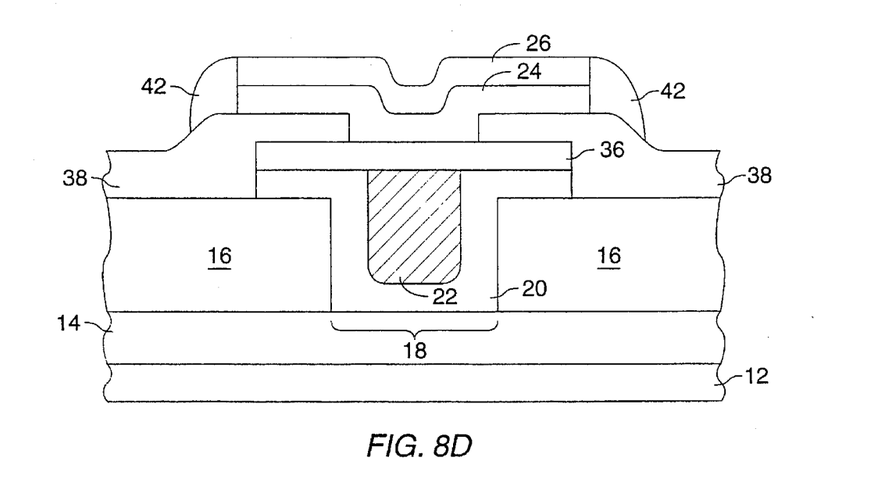

Referring now to FIG. 8d, an oxide layer is deposited over the exposed surface and is etched back to form spacers 42. After the spacers 42 have been formed, upper metal interconnect layer 30 is formed and defined using conventional techniques. The finished structure, after deposition and definition of upper metal interconnect layer 30, is depicted in FIG. 7.

The antifuse according to the fourth embodiment of the present invention may be fabricated with four masks, one to create the antifuse via 18, one to define the stack comprising layers 20 and 36, one to form second antifuse via 40, and one to define the stack comprising layers 24 and 26. The antifuse of this embodiment of,the invention has a capacitance less than that of the embodiments of FIGS. 3 and 5 and also eliminates the topography problems encountered in metal-to-metal antifuses, including depositing the antifuse material layer 20 in the antifuse via 18, dealing with the step coverage issues which cause non-uniform breakdown, and eliminating placement of the antifuse stack on top of the first metal layer where the planarization of the interlayer dielectric and the etch of the first metal interconnect layer become issues.

Figure 9:
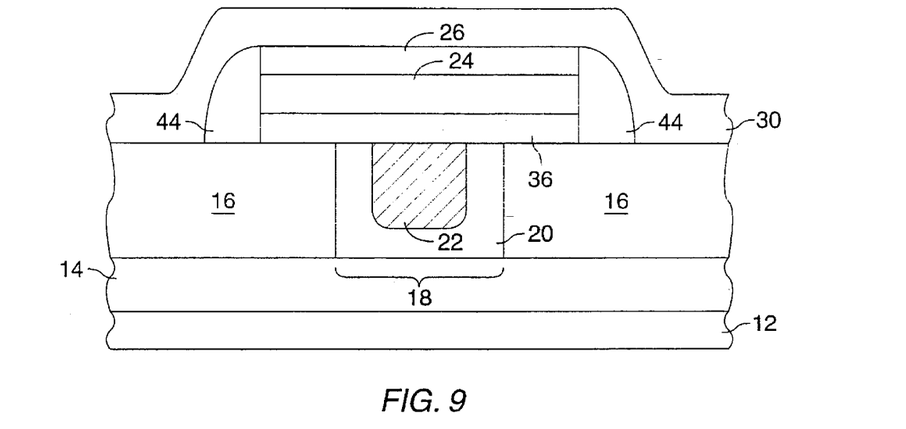
FIG. 9 is a cross-sectional view of an above-via antifuse structure according to a fifth embodiment of the present invention.

Referring now to FIG. 9, a fifth embodiment of the antifuse of the present invention is shown in cross-sectional form. The antifuse of FIG. 9 is similar to the antifuse of FIG. 1 in that the planarization of the conductive material 20 in antifuse via 18 is performed in the same manner. FIGS. 2a–2c illustrate this portion of the process for the antifuse of FIG. 9.

Figure 10A:
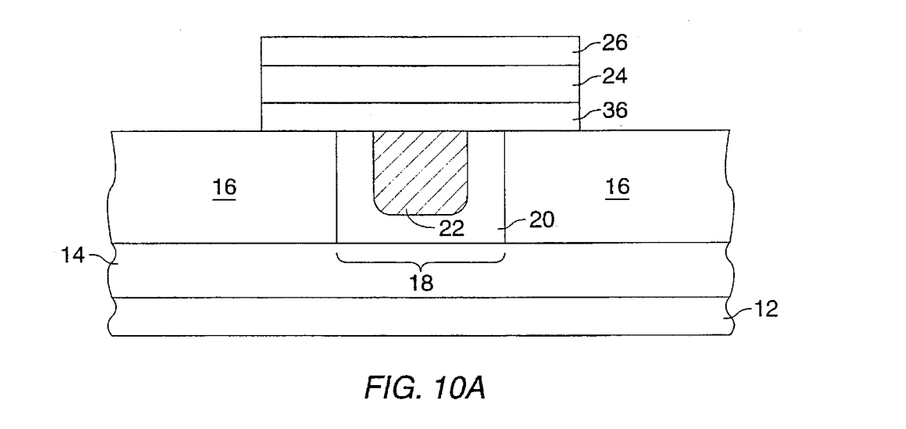
FIGS. 10a–10b are cross-sectional views of the antifuse structure of FIG. 9 at various stages during the progression of the fabrication process.

Referring now to FIG. 10a, an additional conductive layer 36 is formed over the planarized structure. This layer has the same composition as its counterpart in the embodiment of FIG. 7. Antifuse material layer 24 and upper antifuse electrode 26 are then deposited over additional conductive layer 36. The stack comprising layers 36, 24, and 26 is then defined using conventional masking and etching steps. FIG. 10a shows the structure resulting after the masking layer for defining the stacked structure has been removed.

Figure 10B:
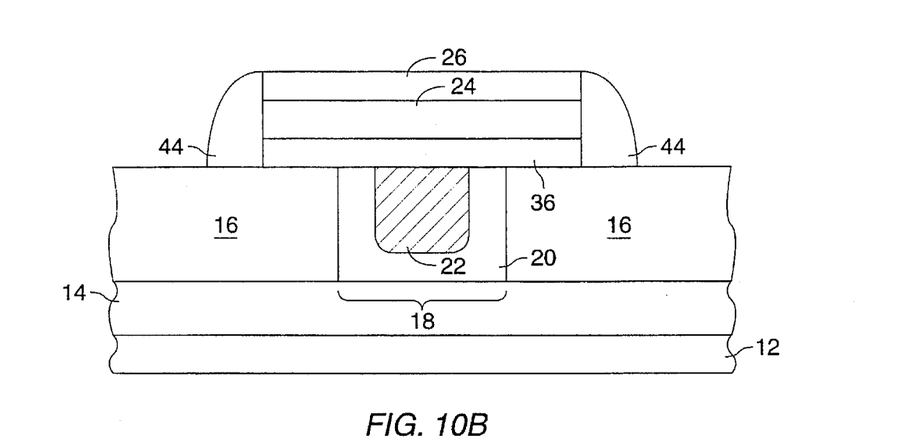

Referring now to FIG. 10b, spacers 44 are formed by depositing a layer of silicon dioxide and etching it back to leave spacers 44 at the edges of the stack comprising layers 36, 24, 26. The next step comprises forming and defining upper metal interconnect layer 30 using conventional semiconductor fabrication processes. The finished antifuse structure is depicted in FIG. 9.

Variations of the antifuse structures herein include structures wherein a layer of a material such as TiW over the planarized surface prior to formation of subsequent layers. These embodiments are equivalent to the disclosed embodiments.

Those of ordinary skill in the art will recognize that, although the disclosure of the present invention has been made in terms of first and second metal interconnect layers, and that tile terminology used in the claims has been consistent therewith, the present invention relates to antifuses disposed between metal layers generally, and is equally applicable to antifuses disposed between any metal layers, for example, the first and second, second and third, and first and third metal layers in a three metal layer structure. Thus the words "first" and "third" are not to be restricted in meaning by the number of metal layers in a particular integrated circuit containing antifuses fabricated according to the present invention. In addition, such skilled persons will recognize that the capping layers separately referred to herein may in some cases comprise one layer of multi-layer metal interconnect layers which are known in the art.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. An above-via antifuse disposed in a microcircuit, said antifuse comprising:
   a first metal interconnect layer disposed over an electrically insulating portion of the microcircuit;
   an interlayer dielectric layer disposed over said first metal interconnect layer, said interlayer dielectric layer having an upper surface, said interlayer dielectric layer having an antifuse via formed therein to expose said first metal interconnect layer;
   a metal layer disposed in said antifuse via in electrical contact with said first metal interconnect layer and having a cup-like shape with a conductive rim;
   an electrically non-conductive planarizing material disposed in a volume of said antifuse via not occupied by said metal layer, said conductive rim of said metal layer, said planarizing material and said upper surface of said interlayer dielectric layer forming a substantially planar surface;
   an antifuse material layer disposed over said substantially planar surface and in contact with said conductive rim of said metal layer and said planarizing material; and
   a second metal interconnect layer disposed over and in contact with said antifuse material layer.

2. An above-via antifuse according to claim 1 further comprising a metal capping layer disposed between and in contact with said antifuse material layer and said second metal interconnect layer.

3. An above-via antifuse according to claim 2, further including spacers disposed at sidewalls of said antifuse material layer and said metal capping layer.

4. An above-via antifuse according to claim 1 wherein said metal layer is formed from TiW.

5. An above-via antifuse disposed in a microcircuit, said antifuse comprising:
   a first metal interconnect layer;
   a first interlayer dielectric layer disposed over said first metal interconnect layer, said first interlayer dielectric layer having a first antifuse via formed therein to expose said first metal interconnect layer;
   a layer of conducting material disposed in said first antifuse via and having a cup-like shape with a conductive rim;
   an electrically insulating planarizing material disposed in a volume of said antifuse via not occupied by said layer of conducting material, said conductive rim of said layer of conducting material, said planarizing material and said upper surface of said interlayer dielectric layer forming a substantially planar surface;
   a first electrically conductive capping layer disposed over and in contact with said substantially planar surface;
   a second interlayer dielectric layer disposed over said first capping layer;
   a second antifuse via in said second interlayer dielectric layer to expose said first electrically conductive capping layer, said second antifuse via substantially aligned with said first antifuse via;
   an antifuse material layer, at least a portion of which is disposed in said second antifuse via;
   a second electrically conductive capping layer disposed over and in contact with said antifuse material layer; and
   a second metal interconnect layer disposed over and in electrical contact with said second electrically conductive capping layer.

6. An above-via antifuse according to claim 5 wherein said first electrically conductive capping layer and said second metal interconnect layer are formed of the same material.

7. An above-via antifuse according to claim 5, further comprising spacers disposed at sidewalls of said antifuse material layer and said second electrically conductive capping layer.

8. An above-via antifuse according to claim 5 wherein said layer of conducting material is formed from TiW.

9. An above-via antifuse according to claim 1 wherein said electrically non-conductive planarizing material is SOG.

10. An above-via antifuse according to claim 2 wherein said electrically non-conductive planarizing material is SOG.

11. An above-via antifuse according to claim 5 wherein said electrically insulating planarizing material is SOG.

12. An above-via antifuse disposed in a microcircuit, said antifuse comprising:
   a first electrically conductive interconnect layer disposed over an electrically insulating portion of the microcircuit;
   an interlayer dielectric layer disposed over said first electrically conductive interconnect layer, said interlayer dielectric layer having a via formed therein to expose said first electrically conductive interconnect layer;
   an electrically conductive layer disposed in said via in electrical contact with said first electrically conductive interconnect layer, said electrically conductive layer having a cup-like shape with a conductive rim including an upper surface;
   an electrically non-conductive planarizing material disposed in a volume of said via not occupied by said electrically conductive layer, said planarizing material and said upper surface of said conductive rim of said electrically conductive layer forming a substantially planar surface;
   an antifuse material layer disposed over said substantially planar surface; and
   a second electrically conductive interconnect layer disposed over and in contact with said antifuse material layer.

13. An above-via antifuse according to claim 12 wherein said electrically non-conductive planarizing material is SOG.

14. An above-via antifuse according to claim 13 further comprising an electrically conductive capping layer disposed between and in contact with said antifuse material layer and said second electrically conductive interconnect layer.

15. An above-via antifuse disposed in a microcircuit, said antifuse comprising:

a first electrically conductive interconnect layer disposed over an electrically insulating portion of the microcircuit;

an interlayer dielectric layer disposed over said first electrically conductive interconnect layer, said interlayer dielectric layer having a via formed therein to expose said first electrically conductive interconnect layer;

an electrically conductive layer disposed in said via in electrical contact with said first electrically conductive interconnect layer and partially overlapping said interlayer dielectric layer, said electrically conductive layer having a cup-like shape with a conductive rim including an upper surface;

an electrically non-conductive planarizing material disposed in a volume of said via not occupied by said electrically conductive layer, said planarizing material and said upper surface of said conductive rim of said electrically conductive layer forming a substantially planar surface;

an antifuse material layer disposed over said substantially planar surface; and a second electrically conductive interconnect layer disposed over and in contact with said antifuse material layer.

16. An above-via antifuse according to claim 15 wherein said electrically non-conductive planarizing material is SOG.

17. An above-via antifuse according to claim 15 further comprising an electrically conductive capping layer disposed between and in contact with said antifuse material layer and said second electrically conductive interconnect layer.

18. An above-via antifuse disposed in a microcircuit, said antifuse comprising:

a first electrically conductive interconnect layer disposed over an electrically insulating portion of the microcircuit;

a first interlayer dielectric layer disposed over said first electrically conductive interconnect layer, said first interlayer dielectric layer having a first via formed therein to expose said first electrically conductive interconnect layer;

a first electrically conductive layer disposed in said first via in electrical contact with said first electrically conductive interconnect layer and partially overlapping said first interlayer dielectric layer, said first electrically conductive layer having a cup-like shape with a conductive rim including an upper surface;

an electrically non-conductive planarizing material disposed in a volume of said first via not occupied by said first electrically conductive layer, said planarizing material and said upper surface of said conductive rim of said first electrically conductive layer forming a substantially planar surface;

a second electrically conductive layer disposed over and in contact with said substantially planar surface;

a second interlayer dielectric layer disposed over said second electrically conductive layer, said second interlayer dielectric layer having a second via formed therein to expose said second electrically conductive layer;

an antifuse material layer disposed over said second interlayer dielectric layer and in said second via; and a second electrically conductive interconnect layer disposed over and in contact with said antifuse material layer.

19. An above-via antifuse according to claim 18 wherein said electrically non-conductive planarizing material is SOG.

20. An above-via antifuse according to claim 18 further comprising an electrically conductive capping layer disposed between and in contact with said antifuse material layer and said second electrically conductive interconnect layer.

21. An above-via antifuse according to claim 20 further comprising an electrically non-conductive spacer element disposed about said antifuse material layer and separating said antifuse material layer from said second electrically conductive interconnect layer.

22. An above-via antifuse disposed in a microcircuit, said antifuse comprising:

a first electrically conductive interconnect layer disposed over an electrically insulating portion of the microcircuit;

an interlayer dielectric layer disposed over said first electrically conductive interconnect layer, said interlayer dielectric layer having a via formed therein to expose said first electrically conductive interconnect layer, said interlayer dielectric layer having an upper surface;

a first electrically conductive layer disposed in said via in electrical contact with said first electrically conductive interconnect layer and having a cup-like shape with a conductive rim leaving a void within said via, an electrically non-conductive planarizing material disposed in said void in said via, said planarizing material, said upper surface of said interlayer dielectric layer and said conductive rim of said first electrically conductive layer forming a substantially planar surface;

a second electrically conductive layer disposed over and in contact with said substantially planar surface;

an antifuse material layer disposed over and in contact with said second electrically conductive layer; and a second electrically conductive interconnect layer disposed over and in contact with said antifuse material layer.

23. An above-via antifuse according to claim 22 wherein said electrically non-conductive planarizing material is SOG.

24. An above-via antifuse according to claim 22 further comprising an electrically conductive capping layer disposed between and in contact with said antifuse material layer and said second electrically conductive interconnect layer.

25. An above-via antifuse according to claim 22 further comprising an electrically non-conductive spacer disposed about said antifuse material layer and said second electrically conductive layer and separating said antifuse material layer and said second electrically conductive layer from said second electrically conductive interconnect layer.

26. An above-via antifuse according to claim 24 further comprising an electrically non-conductive spacer disposed about said antifuse material layer and said second electrically conductive layer and separating said antifuse material layer and said second electrically conductive layer from said second electrically conductive interconnect layer.

* * * * *

UNITED STATES PATENT AND TRADEMARK OFFICE
CERTIFICATE OF CORRECTION

PATENT NO. : 5,576,576
DATED : November 19, 1996
INVENTOR(S) : Frank W. Hawley, Yeoucheng Yen It is certified that error appears in the above-indentified patent and that said Letters Patent is hereby corrected as shown below:

Title page, in the Related U.S. Application data, replace "Ser. No. 971,737, Nov. 5, 1992, Pat. No. 5,301,232" with --Ser. No. 971,734, Nov. 4, 1992, Pat. No. 5,308,795--.

---In Col. 1, in the CROSS-REFERENCE TO RELATED APPLICATIONS, replace "Ser. No. 07/971,734, filed Nov. 5, 1992. U.S. Pat. No. 5,301,232" with --Ser. No. 07/971,734, filed Nov. 4, 1992, U.S. Pat. No. 5,308,795--.

---In Col. 2, line 2, replace "400angstroms" with --400 angstroms--.

---In Col. 2, line 65, replace "tile" with --the--.

---In Col. 4, line 34, replace "TiW/AlSiCuFFiW" with --TiW/AlSiCu/TiW--.

---In Col. 4, line 46, replace "tile" with --the--.

---In Col. 4, line 51, replace "tile" with --the--.

---In Col. 4, line 53, replace "18 a" with --18, a--.

---In Col. 5, lines 3-4, replace "amorphous silicon/silicon nitride amorphous silicon" with --amorphous silicon/silicon nitride/amorphous silicon--.

---In Col. 5, line 34, replace "TiW/AlSiCuTTiW" with --TiW/AlSiCu/TiW--.

---In Col. 5, line 66, replace "witit" with --with--.

---In Col. 6, line 2, replace "shown" with --shown.--.

---In Col. 6, line 43, replace "upper metal interconnect" with --upper metal interconnect layer 30--.

---In Col. 7, line 12, replace "materials" with --material--.

UNITED STATES PATENT AND TRADEMARK OFFICE
CERTIFICATE OF CORRECTION

| | |
|---|---|
| PATENT NO. : | 5,576,576 |
| DATED : | November 19, 1996 |
| INVENTOR(S) : | Frank W. Hawley, Yeoucheng Yen |

It is certified that error appears in the above-indentified patent and that said Letters Patent is hereby corrected as shown below:

---In Col. 7, line 14, replace "conductive material" with --conductive material 20--.

---In Col. 7, line 41, replace "spinon" with --spin-on--.

---In Col. 8, line 25, replace "the second upper metal interconnect layer 30" with --the upper metal interconnect layer 30--.

---In Col. 8, line 31, replace "tile" with --the--.

---In Col. 9, line 48, replace "Tile" with --The--.

---In Col. 9, line 49, replace "tile" with --the--.

---In Col. 10, lines 4-5, replace "conductive layer 20 and additional conductive material 36." with --conductive material 20 and additional conductive layer 36.--.

---In Col. 10, line 33, replace "20" with --24--.

---In Col. 11, line 2, replace "tile" with --the--.

Signed and Sealed this

Twenty-ninth Day of April, 1997

*Attest:*

BRUCE LEHMAN

*Attesting Officer*     Commissioner of Patents and Trademarks